United States Patent [19]

DeVito

[11] Patent Number: 5,027,085
[45] Date of Patent: Jun. 25, 1991

[54] PHASE DETECTOR FOR PHASE-LOCKED LOOP CLOCK RECOVERY SYSTEM

[75] Inventor: Lawrence M. DeVito, Tewksbury, Mass.

[73] Assignee: Analog Devices, Inc., Norwood, Mass.

[21] Appl. No.: 519,579

[22] Filed: May 7, 1990

Related U.S. Application Data

[63] Continuation of Ser. No. 416,357, Oct. 3, 1989, abandoned.

[51] Int. Cl.$^5$ .............................................. H03L 7/00
[52] U.S. Cl. ................................. 331/1 A; 307/528; 328/133; 375/120
[58] Field of Search ................. 331/1 A, 25; 307/511, 307/526, 527, 528; 328/133, 134, 155; 375/119, 120

[56] References Cited

U.S. PATENT DOCUMENTS

| | | | |
|---|---|---|---|
| 4,422,176 | 12/1983 | Summers | 307/527 X |
| 4,450,572 | 5/1984 | Stewart et al. | 375/87 |
| 4,475,212 | 10/1984 | McLean et al. | 375/17 |
| 4,535,459 | 8/1985 | Hogge, Jr. | 331/1 A X |
| 4,806,878 | 2/1989 | Cowley | 331/1 A |

OTHER PUBLICATIONS

Hogge, Charles R., Jr., "A Self-Correcting Clock Recovery Circuit", Journal of Lightwave Technology, vol. LT-3, No. 6, Dec. 1985, pp. 1312-1314.
Shin et al., "Self-Correcting Clock Recovery Circuit with Improved Jitter Performance", Electronics Letters, vol. 23, No. 3, Jan. 29, 1987, pp. 110-111.

Primary Examiner—Robert J. Pascal
Attorney, Agent, or Firm—Wolf, Greenfield & Sacks

[57] ABSTRACT

A phase-detector circuit for a phase-locked loop clock recovery system detects the phase difference between an information signal and a clock signal and produces a phase error signal representative of the phase difference. The phase detector includes, in one embodiment, five latches, serially interconnected, with the first latch receiving the information signal and each subsequent latch receiving the data output of the previous latch. The latches are enabled, in an alternating pattern, by the high-level and low-level portions of the clock signal. A first exclusive-OR (XOR) gate receives a delayed information signal and the data output of the second latch. A second XOR gate receives the data output of the second latch and the data output of the third latch. A third XOR gate receives the data output of the third latch and the data output of the fourth latch. A fourth XOR gate receives the data output of the fourth latch and the data output of the fifth latch. A control element, responsive to the outputs of the first, second, third and fourth XOR gates, controls the voltage across a capacitor, which has at least one electrode serving as an output terminal for producing the phase error signal. The phase-locked loop clock recovery system provides zero static phase offset and minimal phase jitter in response to data density variations in the information signal.

27 Claims, 8 Drawing Sheets

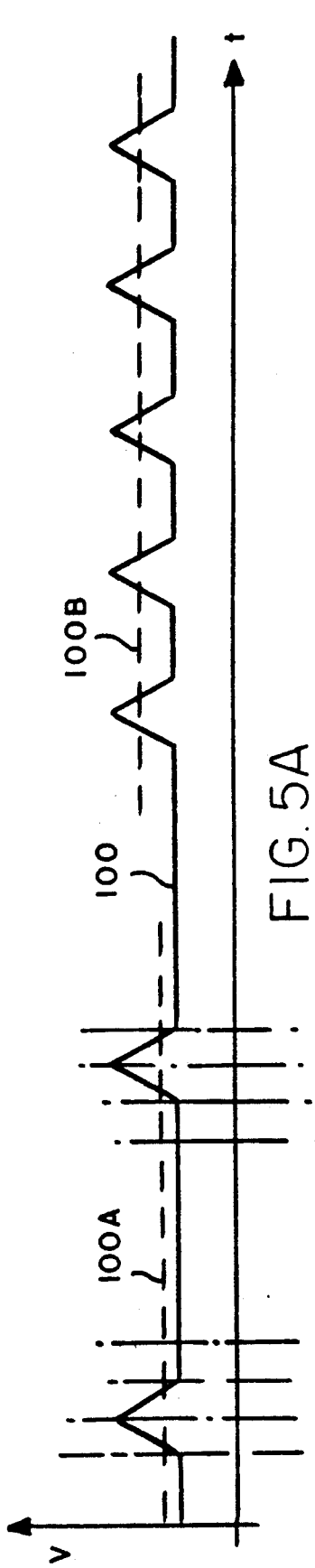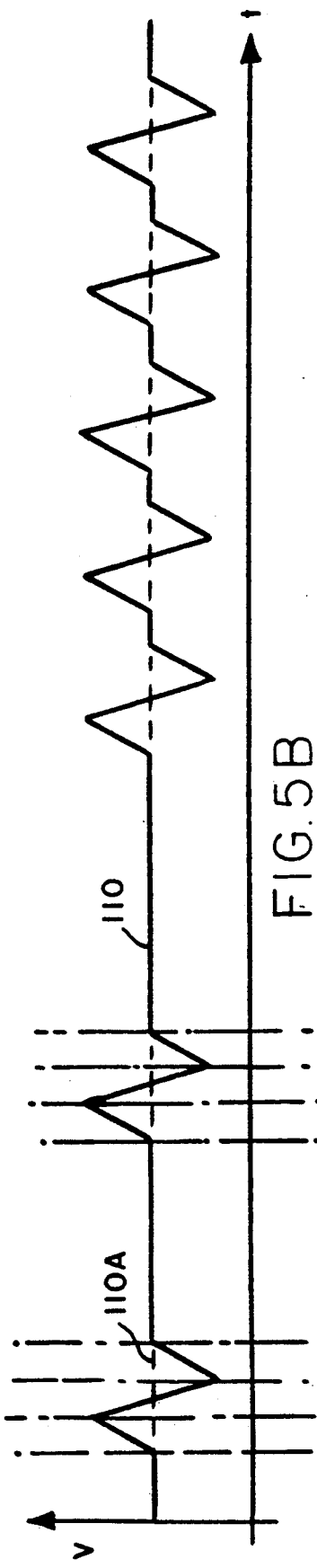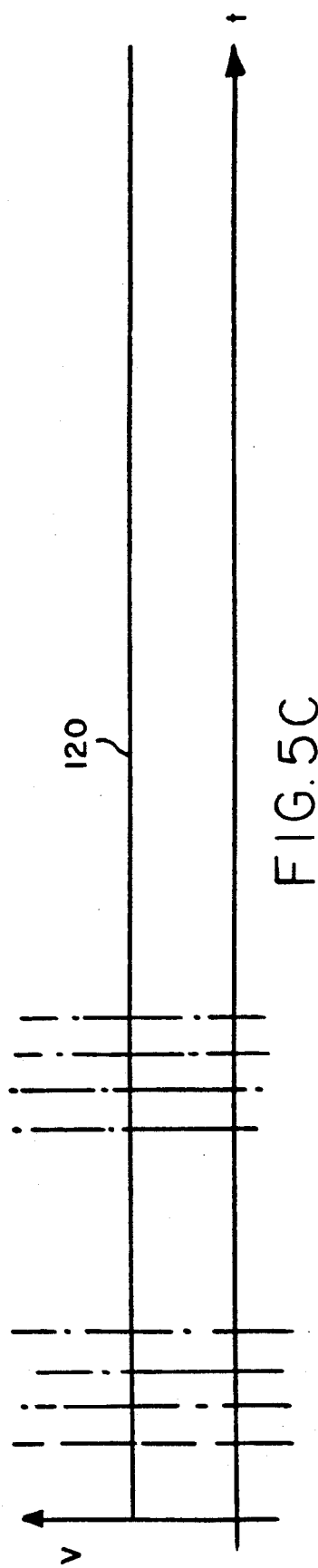

PHASE DETECTOR FOR PHASE-LOCKED LOOP CLOCK RECOVERY SYSTEM

CROSS-REFERENCE TO RELATED APPLICATIONS

This application is filed co pendinq with my prior U.S. patent application Ser. No. 07/416,357 filed Oct. 3, 1989, the benefit of which filing date is claimed under 35 U.S.C. §120.

1. Field of the Invention

The present invention relates to the field of digital data transmission, and more specifically to a phase detector for use in a phase locked loop clock recovery system. In particular, the present invention provides a phase detector which, when used in a phase locked loop, provides quaranteed zero static phase offset and low jitter in response to input data density variations.

2. Background of the Invention

In systems for synchronous transmission of diqital data, an information signal is transmitted, at a constant rate, by a transmitting unit and received, at the same rate, by a receivinq unit. An information signal which comprises a binary data signal and a clocking signal in combination, is often described as a self clocking signal (e.q., a return to zero (RZ) signal). An information signal which does not contain a clocking signal combined with a binary data signal is referred to as a non-self clocking signal (e.g., a non return to zero (NRZ) signal). Non self clocking signals are advantageous in that they require only one half of the bandwidth necessary for transmission of a self clocking signal. Unfortunately, a receiving unit must contain complex circuitry to derive the bit cell timing of a non self clocking signal. Many such receiving units use phase-locked loop (PLL) clock recovery systems for synchronizing a local oscillator in the receiving unit with an NRZ signal. Typically, the PLL detects the phase difference between the received NRZ data and the local oscillator, and modulates the frequency of the local oscillator to bring the received bit cells into the same phase and frequency as the NRZ data signal at the transmitter unit.

One such prior art clock recovery circuit containing a phase detector is illustrated in FIG. 1. The description and theory of operation of this circuit is found in an article entitled "A Self Correcting Clock Recovery Circuit", *Journal of Lightwave Technology*, Vol. LT-3, No. 6, December 1985 by Charles R. Hoqge, Jr., which is incorporated herein by reference. The circuit described therein provides timing of data as an integral part of the phase detector function in a phase locked loop. Although the Hogge circuit addresses the problem of phase offsets in clock recovery systems, the circuit produces undersirable phase jitter in the presenc of data density variations.

In this context, jitter is defined as abrupt, spurious variations in the phase of successive pulses, as referenced to the phase of a continuous oscillator. Data density, in this context, refers to the transitions in a binary data signal from a high signal (1) to a low signal (0) or vice versa. Binary data, having a larqe number of transitions in a given time interval, is said to have a high data density. Conversely, binary data having relatively few transitions in a given time interval is said to have a low data density. Variations in data density refers to data which has high density data and low density data interspersed.

In addition, a deficiency in the Hoqqe phase detector circuit concerns the propagation delay from node 2 to node 3 upon a rising clock edge. The pulse at the output of exclusive OR gate U2 at node 6 is initiated by the asynchronous arrival of an input data transition and is terminated by a rising clock edge after propagation delay through flip flop U1. The pulse at node 7 is both initiated and terminated with a propaqation delay relative to the clock. Thus, only for a static phase error equal to the propagation delay of flip flop U1 will the pulse width at node 6 be equal to that at node 7. In his article, Hoqge addresses this issue with the implementation of a delay line, an unsatisfactory solution for monolithic inteqration of such a circuit.

An improvement upon the prior art circuit of FIG. 1 is illustrated in the prior art circuit of FIG. 2. The description and theory of operation of this circuit is found in an article entitled "Self Correcting Clock Recovery Circuit With Improved Jitter Performance", *Electronics Letter*, Vol. 23, No. 3, p. 110, Jan. 29, 1987 by Shin, Park and Lee, which is incorporated herein by reference. The circuit disclosed in the Shin article reduces phase jitter by adding a delay line to the circuit. The delay line must provide a time delay equal to one half of the clock period. If the delay deviates from this value, the delay line will fail to eliminate jitter from the phase locked loop. Unfortunately, a delay line is not a convenient component to deal with, especially at low frequencies which may require long delays. Further, as stated above, a delay line is impractical to integrate inexpensively and compactly into a monolithic implementation of such a circuit.

It is therefore an object of the present invention to provide a phase locked loop clock recovery system which is suitable for monolithic integration.

Another object of the present invention is to provide the phase locked loop clock recovery system which does not utilize a delay line as part of the phase locked loop.

Yet another object of the present invention is to provide a phase locked loop clock recovery system which has low phase jitter.

Still another object of the present invention is to provide a phase locked loop clock recovery system which guarantees zero static phase offset between the recovered clock and the received bit cells.

A further object of the present invention is to provide a phase detector circuit, for use with a phase locked loop clock recovery system, which is simple and accurate.

Yet another object of the present invention is to provide a phase detector, for use with a phase locked loop clock recovery system, which performs accurately in the presence of data density variations.

SUMMARY OF THE INVENTION

The foregoing and other objects of the present invention are achieved with an improved phase detector which, when used in a phase locked loop clock recovery system, simultaneously provides guaranteed zero static phase offset and low phase jitter in response to data density variations in either a self clocking or a non-self clocking signal. The phase detector circuit is further simple, accurate, and suitable for monolithic integration.

According to the present invention, a phase detector circuit for detecting the phase difference between an information signal and a clock pulse and for producing, at an output terminal thereof, a phase error signal representative of the phase difference includes at least three information signal sampling modules, each of the sampling modules containing a flip flop having a data input and a data output and being clocked by a clock pulse. Each of the signal sampling modules further includes an exclusive OR gate having one input connected to the data input of its flip-flop and a second input connected to the data output of its flip flop. The signal sampling modules are arranged so that a first of the signal sampling modules receives at its data input, the information signal and is clocked by a selected phase of the clock pulse. Each $i^{th}$ module subsequent to the first sampling module receives at its data input the data output of the $(i-1)^{th}$ module, the $i^{th}$ module being clocked on a different phase of the clock pulse than the $(i-1)^{th}$ module. The phase detector circuit further includes a control element responsive to the outputs of the exclusive OR gates of the sampling modules for creating the phase error signal therefrom.

In one embodiment, the phase detector circuit consists of three signal sampling modules. In a second embodiment, the phase detector circuit consists of four signal sampling modules. The flip flops of the phase detector circuit may be substituted with functionally equivalent latches.

The control element responsive to the outputs of the exclusive OR gates may include a plurality of current sources, each associated with one of the sampling modules. Each current source has a first lead connected to ground. The control element may further include a plurality of switches, each associated with one of the sampling modules. Each switch is responsive to the output of the exclusive OR gate of its associate sampling module for connecting the second lead of the current source associated with that sampling module to the output terminal of the phase detector circuit when the output of the exclusive-OR gate produces a logical true signal. The control element may further include a capacitor having a first electrode connected to ground and a second electrode serving as the output terminal of the phase detector circuit for producing the phase error signal.

The phase error signal produced at the output terminal is received by a loop filter which modifies the phase error signal and modulates the frequency of a voltage controlled oscillator accordingly. The pulse train output of the voltage controlled oscillator serves as the retimed clock signal for the phase detector circuit, to complete the phase locked loop clock recovery system. The data output of the second latch represents the information signal in phase with the clock signal.

The invention will be more fully understood from the detailed description set forth below, which should be read in conjunction with the accompanying drawings. The invention is defined in the claims appended at the end of the detailed description, which is offered by way of example only.

BRIEF DESCRIPTION OF THE DRAWING

In the drawing:

FIG. 5A is a diagram of the waveform produced at the voltage output of the prior art circuit of FIG. 1.

FIG. 5B is a diagram of the waveform produced at the voltage output of the inventive phase detector circuit of FIG. 3;

FIG. 5C is a diagram of the waveform produced at the voltage output of the prior art circuit of FIG. 2;

DETAILED DESCRIPTION

Figure 3:
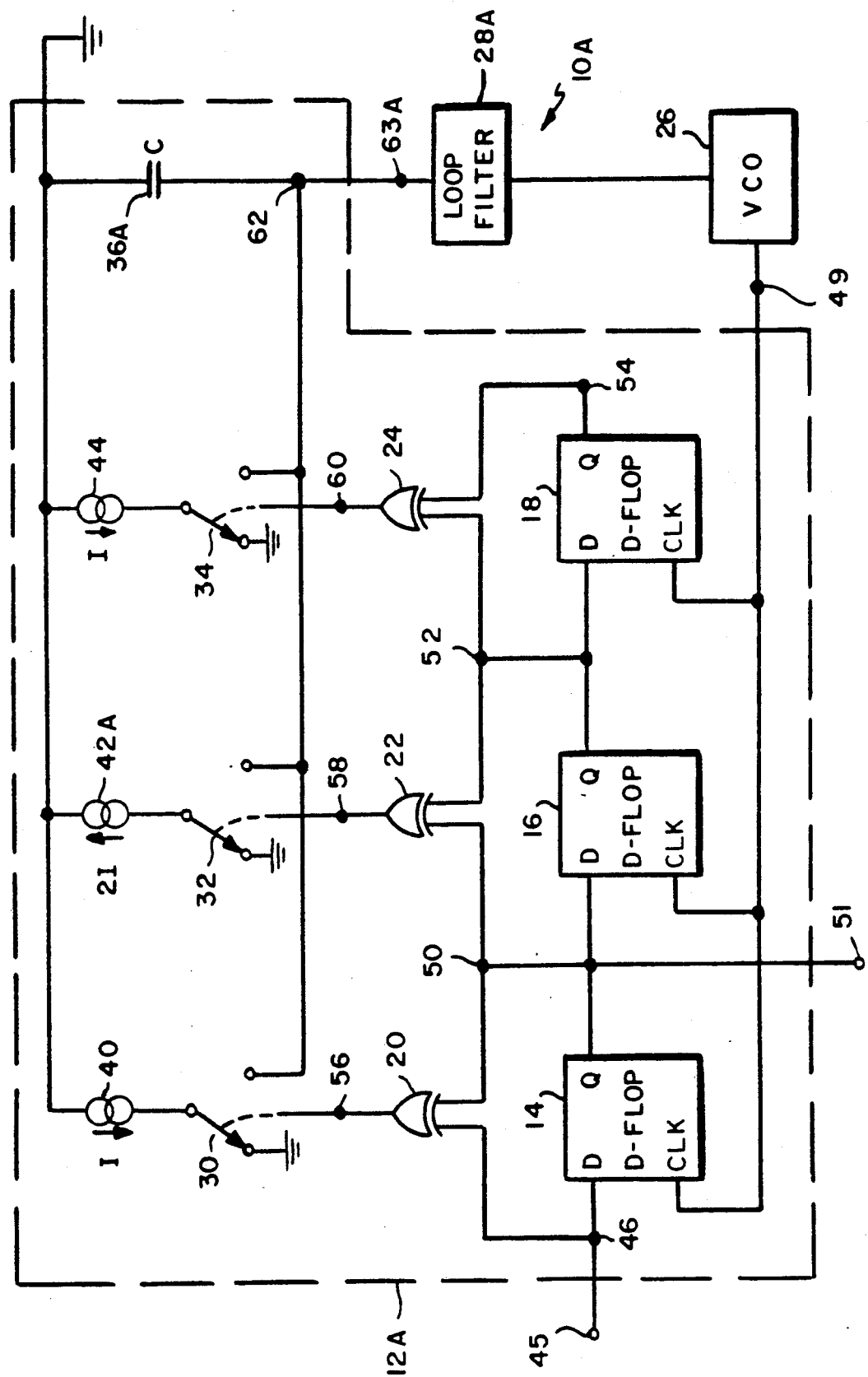
FIG. 3 is a schematic diagram of a first embodiment of a phase detector and phase locked loop clock recovery circuit in accordance with the present invention.

Referring to the drawings, and in particular FIG. 3, one implementation of an improved phase detector 12A is shown in conjunction with PLL clock recovery circuit 10A. Circuit 10A typically comprises phase detector 12A, enclosed in a dashed line, loop filter 28A and voltage controlled oscillator (VCO) 26.

Phase detector 12A is comprised of three D-type flip-flops 14, 16 and 18; three two-input exclusive-OR (XOR) gates 20, 22 and 24; three single-pole, double-throw (SPDT) switches 30, 32 and 34; three current sources 40, 42 and 44; a capacitor 36A; data input terminal 45; retimed data output terminal 51; recovered clock input terminal 49; and phase error output terminal 63A.

D-type flip-flops 14 and 18 operate on the rising edge of a clock pulse, while D-type flip-flop 16 operates on the falling edge of a clock pulse. NRZ data is supplied, via data input terminal 45, data to the D input of flip-flop 14 and a first input of XOR gate 20. The Q output of flip-flop 14 is connected to the D input of flip-flop 16, as well as a second input of XOR gate 20 and a first input of XOR gate 22. Similarly, the Q output of flip-flop 16 is connected to the D input of flip-flop 18, as well as a second input of XOR gate 22 and a first input of XOR gate 24. The Q output of flip-flop 18 is connected to a second input of XOR gate 24. The, Q output of flip-flop 14 is connected to recovered data output terminal 51. The clock inputs of flip-flops 14, 16, and 18 are connected to the retimed clock input terminal 49. Each flip-flop 14, 16 and 18 in combination with an XOR gate 20, 22 and 24, respectively, forms a signal sampling module.

Current source 40 is connected intermediate ground and the pole of switch 30. The output of XOR gate 20 is used as a control voltage to set switch 30 to either a first or second position, connecting current source 40 to ground or the second electrode of capacitor 36A, respectively. In the preferred embodiment, when the output of XOR gate 20 produces a false (or zero) signal, switch 30 will connect current source 40 to ground.

In a similar manner, current source 42A, which supplies a current of twice the magnitude and opposite polarity of current source 40, is connected intermediate ground and the pole of switch 32. The output of XOR gate 22 is used as a control voltage to set switch 32 to either a first or second position, connecting current source 42 to ground or the second electrode of capacitor 36A, respectively. In the preferred embodiment, when the output XOR gate 22 produces a false signal, switch 32 will connect current source 42A to qround.

Likewise, current source 44, which provides a current of the same magnitude and polarity as current source 40, is connected intermediate ground and the pole of switch 34. The output of XOR gate 24 is used as a control voltage to set switch 34 to either a first or second position, connecting current source 44 to ground or the second electrode of capacitor 36A, respectively. In the preferred embodiment, when the output of exclusive-OR qate 24 produces a false signal, switch 34 will connect current source 44 to ground.

A first electrode of capacitor 36A is connected to ground. The second electrode of capacitor 36 is connected to phase error output terminal 63A of phase detector 12A. The configuration of capacitor 36A is often referred to as a "single-ended" configuration.

Loop filter 28A and VCO 26, in conjunction with phase detector 12A, comprise a phase-locked loop clock recovery circuit 10A. The phase error output terminal 63A of phase detector 12A is coupled to the input of loop filter 28A, as shown in FIG. 3. Loop filter 28A is a conventional lead lag circuit in which the reactive elements provide a zero frequency and a pole frequency, the zero frequency being less than pole frequency. The gain of the lead-lag circuit is constant below the zero frequency and above the pole frequency. The qain of the lead-lag circuit increases as a function of frequency between the zero and pole frequencies. The desiqn of such a loop filter will be obvious to electrical engineers familiar with phase-locked loops. The output of loop filter 28A is connected to the control input of VCO 26.

VCO 26 is a conventional voltage-controlled oscillator which produces, at its output, a train of clock pulses, the frequency of which is dependent upon the voltage present at the control input of the VCO. The design of such a voltage-controlled oscillator is obvious to electrical engineers, many such products being commercially available. The output of VCO 26 is connected to the recovered clock input terminal 49 of phase detector 12A.

A discussion of the operation of the above described phase detector 12A and phase-locked loop clock recovery system 10A follows. To facilitate the explanation of the circuit's operation, several nodes in the circuit are qiven reference numerals. The timing diagram of FIG. 4 illustrates the various voltage waveforms present at these nodes at times $t_0-t_{16}$.

As an initial condition, switches 30, 32 and 34 are assumed to be set to divert their respective current sources to qround.

Figure 4:
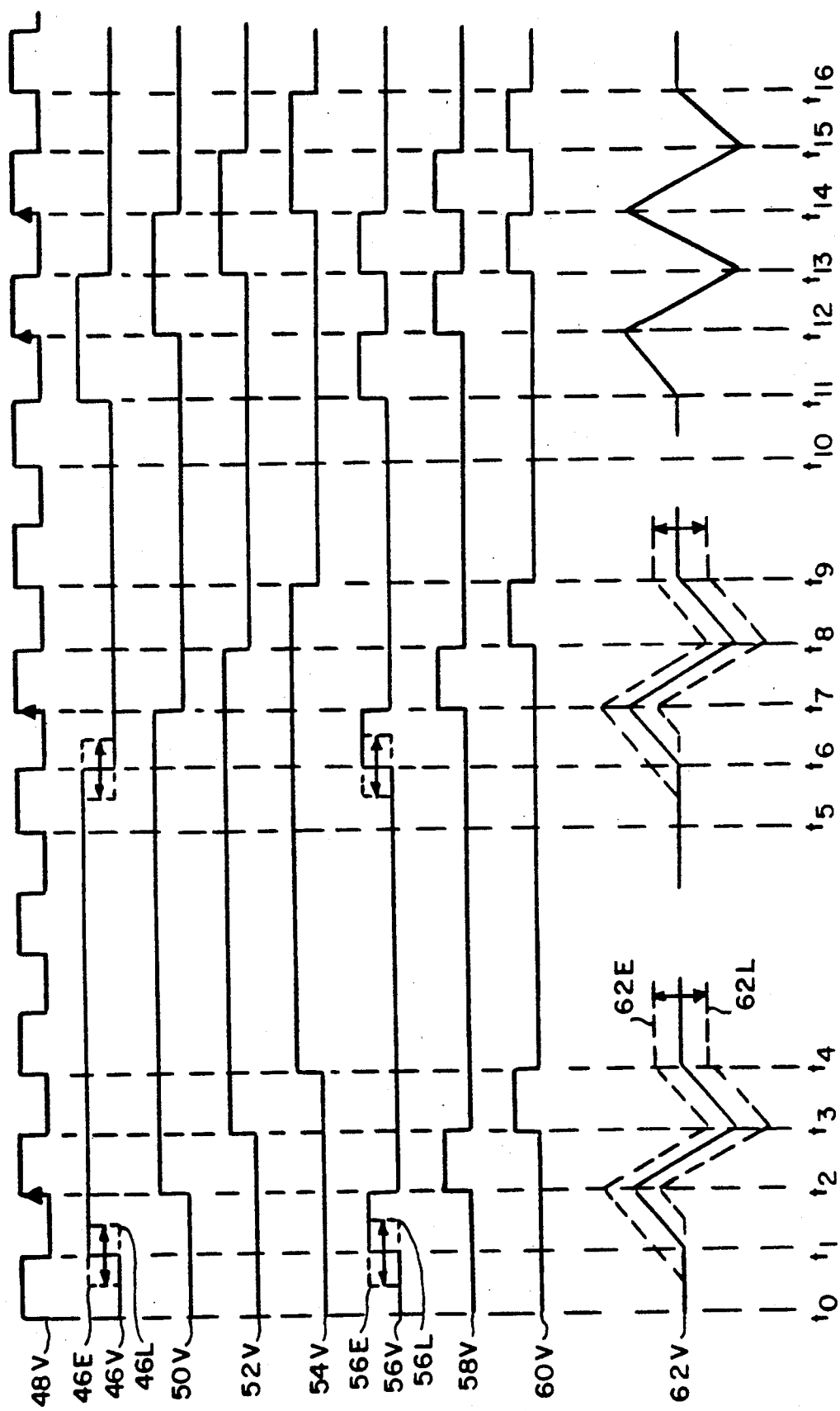
FIG. 4 is a timing diagram illustrating the waveforms produced at various nodes in the circuit of FIG. 3.

Referring to FIGS. 3 and 4, data input terminal 45 supplies NRZ data from the environment to the D input of flip-flop 14 at node 46. At time $t_1$ when a data edge arrives at node 46, XOR gate 20 compares the D input and Q output of flip-flop 14, nodes 46 and 50, respectively. When the logic values at nodes 46 and 50 are different, XOR gate 20 produces a logic true signal at its output, node 56, setting switch 30 to divert current from current source 40 to capacitor 36A. The increased current to capacitor 36A cause the voltage at node 62 and phase error output terminal 63A, to increase at a constant rate. The rate is determined by the output of current source 40 and the capacitance of capacitor 36A. The resulting waveform produced at phase error output terminal 63A is indicated by the upwards "ramp" illustrated by signal 62V of FIG. 4. The signal produced at phase error output terminal 63A is a phase error signal representative of the phase difference between an incoming data edge, present at data input terminal 45, and the clock pulse present at retimed clock input terminal 49.

At time $t_2$, when the next rising clock edge arrives at the clock input, of flip-flop 14, the data at node 46 is transferred to the Q output of flip-flop 14, node 50. XOR gate 20 detects the same signal at the D input and Q output of flip-flop 14, nodes 46 and 50, respectively. Accordingly, XOR gate 20 produces at its output, node 56, a logic false signal setting switch 30 to divert current from current source 40 to ground. However, XOR qate 22 detects that the D input and Q output of flip-flop 16, nodes 50 and 52, respectively, are different. XOR gate 22 produces a logic true signal at its output, node 58, setting switch 32 to divert current from current source 42A to capacitor 36. Since the output of current source 42A is of twice the magnitude and opposite polarity of current source 40, as indicated in FIG. 3, charge is drawn from capacitor 36A causing the voltage at output node 62 and terminal 63A to ramp downwards at twice the rate of the prior upward ramp, as illustrated in FIG. 4.

At time $t_3$, when the next falling edqe of the clock arrives at the clock input of flip-flop 16, the signal present at the D input of flip-flop 16, node 50, is transferred to the Q output of flip-flop 16, node 52. XOR gate 22 detects that nodes 50 and 52 are the same and produces a loqic false signal at its output, node 56, setting switch 32 to divert current from current source 42A to ground. At the same time, XOR gate 24 detects that the D input and Q output of flip-flop 18, nodes 52 and 54, respectively, are different. Accordingly, XOR gate 24 produces a logic true signal at its output, node 60, setting switch 34 to divert current from current source 44 to capacitor 36A. Since current source 44 produces a current of the same magnitude and polarity as current source 40, the voltage at output node 62 and terminal 63A again ramps upward at a rate determined by the output of current source 44 and the capacitance of capacitor 36A.

At time $t_4$, when the next rising edge of the clock signal arrives at the clock input of flip-flop 18, the signal present at the D input of flip-flop 18, node 52, is transferred to the Q output of flip-flop 18, node 54. XOR qate 24 detects the like value at nodes 54 and 52 and produces a logical false signal at its output, node 60, setting the switch 34 to divert current from current source 44 to ground.

The phase error signal produced by phase detector 12A at phase error output terminal 63A is connected to the input of loop filter 28A. Loop filter 28A stabilizes the loop response and may provide amplification or attenuation for the VCO control signal. It also eliminates any high frequency transient voltages or spikes. The modified phase error signal then modulates the frequency of the pulse train produced at the output of VCO 26. The retimed clock pulses are supplied to phase detector 12A at retimed clock input terminal 49. In this manner, a self correcting loop is formed, to facilitate synchronizing the phase and frequency of the clock pulses of VCO 26 with the received NRZ data signal supplied to phase detector 12A.

Referring to FIGS. 3-4, the signals present at the outputs of XOR gates 22 and 24, signals 58V and 60V, respectively, are high (or true) for one half of a clock cycle, while the signal at the output of XOR gate 20, node 56 (signal 56V), may be high for more or less than one half of a clock cycle. The pulse at node 56 can start at any time since it is initiated by the asynchronous arrival of a data transition. This pulse, however, is terminated by the rising edge of the next clock pulse as at time $t_2$. If the data transition at node 46 is coincident with a falling edge of the clock, then the output of XOR gate 20, node 56, will be high for one-half of a clock cycle. This is a condition defined as zero phase error. In this case, the phase error voltage at node 62 (signal 62V) remains unchanged after the sequence of ramps previously described.

If the input data transition is early, as indicated by rising edge 46E of FIG. 4, node 56 is high for longer than one-half of a clock cycle and the phase error voltage at node 62 is displaced upwardly, as indicated by signal 62E, shown in dashed lines in FIG. 4. In this case, signal 62E is the new "resting level" of the phase error signal produced by phase detector 12A. Subsequent in-phase data transitions will leave this new resting level unchanged, however, out-of-phase data transitions will cause subsequent modifications to this resting level. If the input data transition is late, as indicated by rising edge 46L of FIG. 4, node 56 is high for less than one-half a clock cycle, and the voltage at output node 62 is displaced downwardly, as indicated by signal 62L, shown in dashed lines in FIG. 4. In this case, the level of signal 62L at time $t_4$ becomes the new resting level of the phase error signal of phase detector 12A. Measurement of zero phase error does not increment the phase accumulated by the VCO 26 in excess of the average rate, thereby resulting in low phase jitter.

A time interval of one and a half clock cycles is required to measure phase error. If the input data transition is one-half of a clock cycle early, two clock cycles are required to measure zero phase error. If the input data transition is one-half of a clock cycle late, one clock cycle is required to measure phase error. If data transitions arrive on consecutive clock cycles, the second phase measurement begins before the first measurement ends. However, as seen at time $t_{10}-t_{16}$, resolution of consecutive data transitions do not interfere, as both node 56 (signal 56V) and node 60 (signal 60V) may be high simultaneously. If the second transition is early, node 56 may be high while node 60 is high as well. Since nodes 56, 58 and 60 each control separate switches, the currents of current sources 40, 42 and 44 sum, and the phase error measurements are independent. In this manner, two different phase measurement may occur simultaneously, yet independently, of one another in a non interferring, "pipelined" manner.

In light of the above explanations with regard to the voltage changes at nodes 48-62 from the time interval $t_0-t_4$, the subsequent voltage changes at time interval $t_5-t_9$ and $t_{10}-t_{16}$ will be obvious to those reasonably skilled in the art and will not be explained hereinafter.

Figure 1:
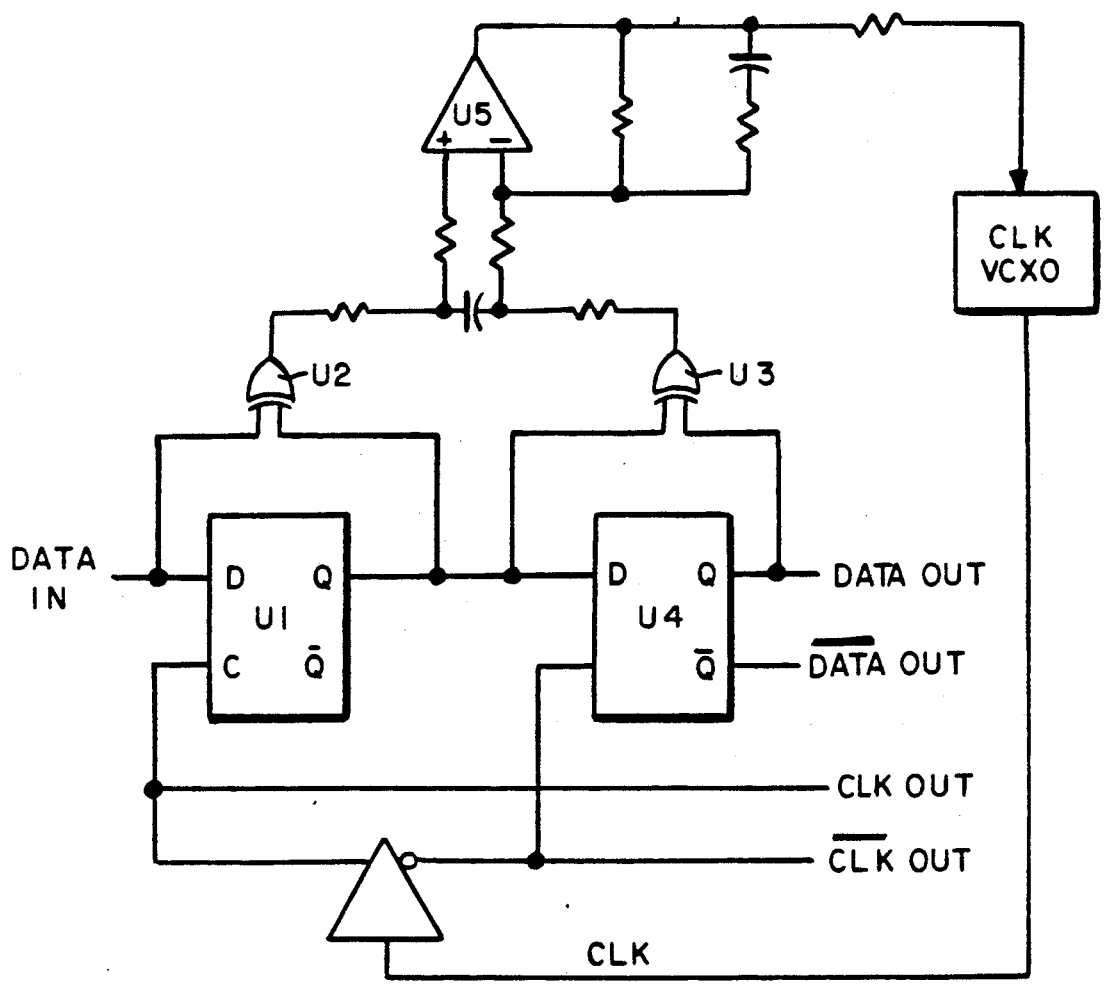
FIG. 1 is a schematic diagram of a first prior art self-correcting clock recovery circuit.
Figure 2:
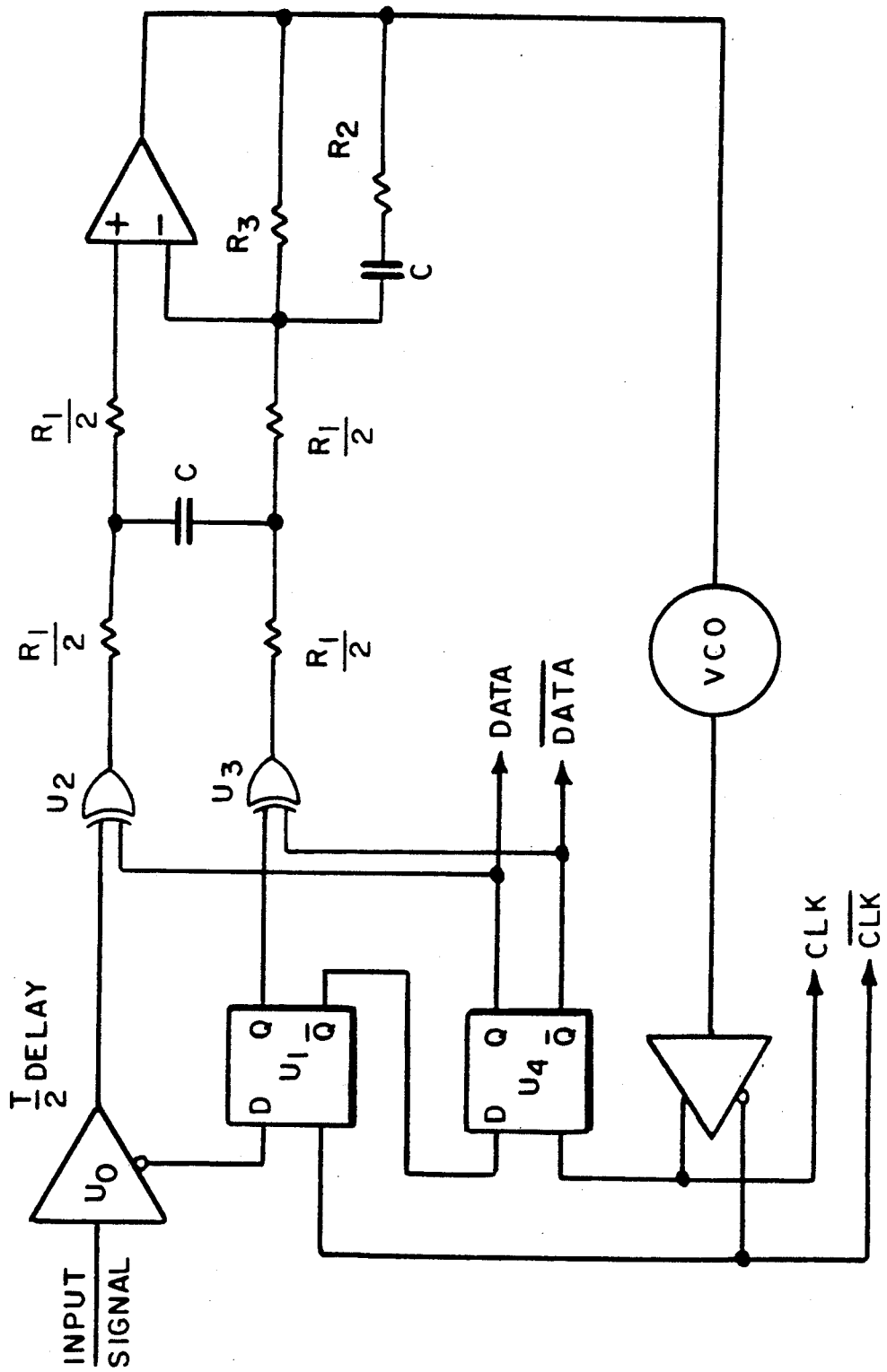
FIG. 2 is a schematic diagram of a second prior art self correcting clock recovery circuit.

FIGS. 5A-C illustrates comparatively the phase error voltages produced by the circuits of FIGS. 1, 3 and 2, respectively, in response to variations in data density. Waveforms 100, 110 and 120 are characteristic of the phase error voltages of the circuits of FIGS. 1, 3 and 2, respectively, in response to zero phase error.

Referring to FIG. 5A, the VCO in the Hogge circuit responds to the average voltage produced by the phase detector circuitry therein. The average voltage values of waveform 100 are presented in FIG. 5A as lines 100A and 100B. With regard to waveform 100, when the data the density changes abruptly, the average voltage value at the output of the phase detector circuitry changes and the phase-locked loop must compensate. Phase errors are committed in the process of adjusting the "resting level" so that the average voltage value, will be correct. These phase errors are manifest as jitter in the circuit output.

Referring to FIG. 5B, in the waveform 110 produced by the inventive circuit, the average value, represented as line 110A, is unaffected by variations of data density, and the "resting level" need not change. In FIG. 5C, the waveform 120 produced by the circuit of FIG. 2 is, ideally, flat and never produces jitter, however, a delay line is required, as stated previously.

Figure 6:
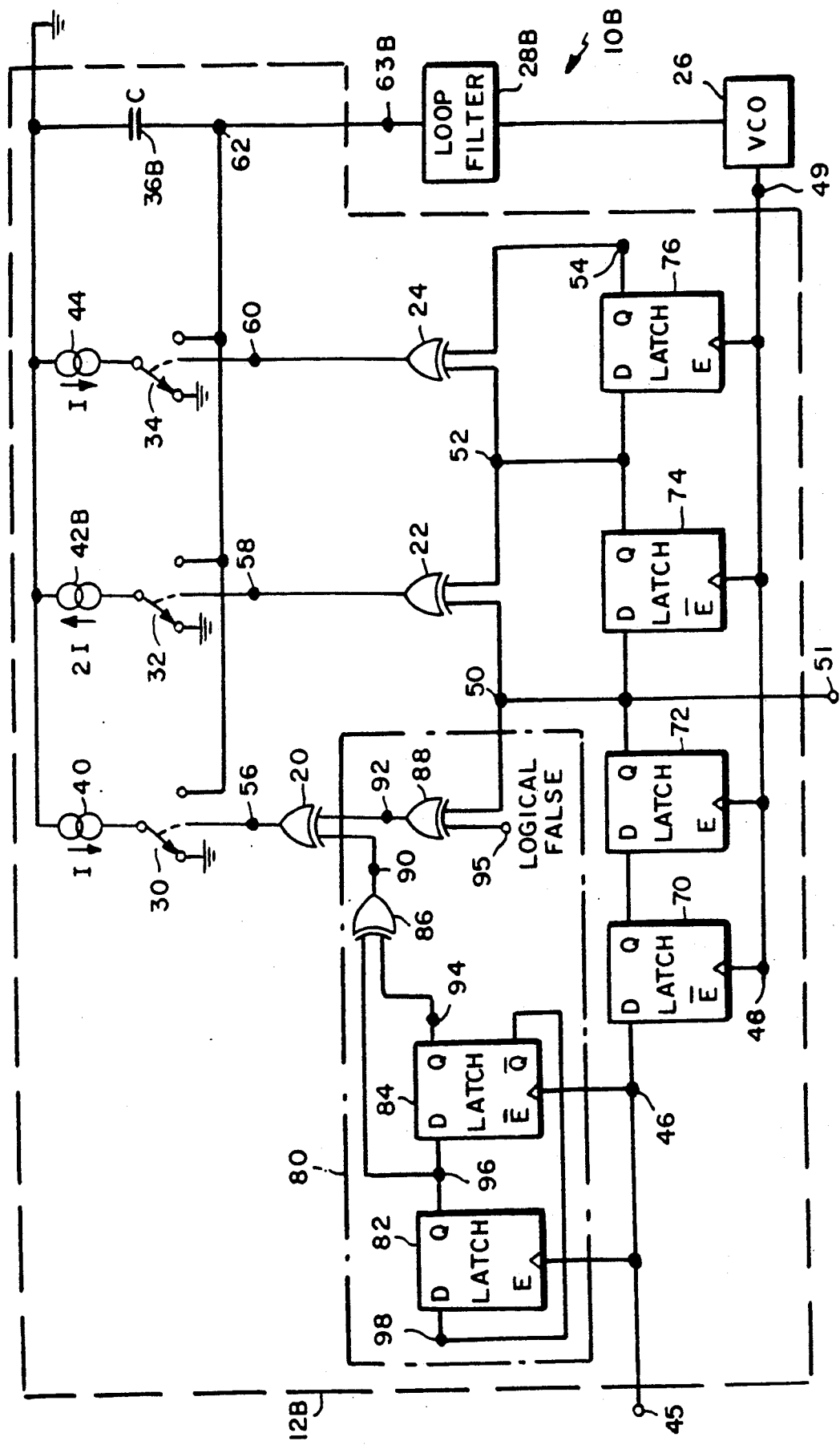
FIG. 6 is a schematic diagram of a more complete architecture of the phase detector and phase locked loop clock recovery circuit of FIG. 3, including additional circuitry for propagation delay compensation and equivalent logic components for an optimal monolithic implementation.

Referring to FIG. 6, a more complete architecture useful for monolithically integrating the inventive phase detector and phase-locked loop clock recovery circuit of FIG. 3 is illustrated. Circuit 10B comprises phase detector 12B, loop filter 28B and VCO 26.

With regard to phase detector 12B, functionally equivalent logic components have been substituted for D-type flip-flops 14, 16 and 18 of FIG. 3. Most D-type flip-flops comprise cascaded master and slave latches. When two such D-type flip-flops are cascaded and clocked in anti phase, as in FIG. 3, the slave of the first flip-flop and the master of the second flip-flop perform identical functions, eliminating the need for one or the other latch. Accordingly, D-type flip-flops 14, 16 and 18 of FIG. 3 have been replaced with latches 70, 72, 74 and 76. Each latch holds, at its Q output, either its previous value or the value of its D input, depending on the state of its enable input. Latches 72 and 76 are of the "high-true" type in which the Q output of the latch tracks its D input while the signal present at the enable input is high. Latches 70 and 74 are of the "low-true" type in which the Q output of the latch tracks its D input while the signal present a the enable input is low.

As illustrated in FIG. 6, the data input terminal 45 is connected to the D input of latch 70. The Q output of latch 70 is connected to the D input of latch 72. The Q output of latch 72 is connected to the D input of latch 74, a first input of XOR gate 22 and a second input of XOR gate 20 via delay element 80, as explained hereinafter. The Q output of latch 74 is connected to the D input of latch 76 as well as to a second input of XOR gate 22 and a first input of XOR gate 24. The Q output of latch 76 is connected to a second input of XOR gate 24. The clock pulse output of VCO 26 is supplied to the enable input of each of latches 70, 72, 74 and 76 via the retimed data input terminal 49. The Q output of latch 72 is coupled to the retimed data output terminal 51.

Latches 70 and 72 collectively emulate the function of positive edge triggered D-type flip-flop 14 of FIG. 3. Latches 72 and 74 collectively emulate the function of negative edge triggered D-type flip-flop 16. Latches 74 and 76 collectively emulate the function of the positive edge triggered D-type flip-flop 18.

In addition to the substitution of functionally equivalent logic components for flip-flops 14, 16 and 18 of FIG.ure 3, a delay compensation circuit 80, enclosed in the broken dashed line of FIG. 6, has been added to phase detector 12B to compensate for the inherent propagation delay of latch 72 and to insure that the signals present at the inputs of XOR gate 20 arrive coincidentally. Delay circuit 80 provides a solution to the previously described deficiency of the Hogge circuit, without a delay line and its accompanying limitations.

Delay circuit 80 is comprised of a first delay latch 82, a second delay latch 84, XOR gate 86, and XOR gate 88. Delay latches 82 and 84, which are of the high true and low-true type, respectively, are connected to node 46 and are enabled by the data signals present thereat. The Q* inverting output of latch 84 is connected to the D input of latch 82. The Q output of latch 82 is connected to the D input of latch 84, as well as a first input of XOR gate 86. The Q output of latch 84 is connected to a second input of XOR gate 86. The output of XOR gate 86 is, in turn, connected to a first input of XOR gate 20.

The Q output of latch 72, node 50, is connected to a first input of XOR qate 88. The second input of XOR gate 88, node 95, is permanently tied to logic zero, as illustrated in FIG.ure 6. The signal value present at node 95 depends on whether the positive or negative logic components are used, as will be obvious to those skilled in the art. The output of XOR gate 88 is connected to a second input of XOR 20.

Figure 7:
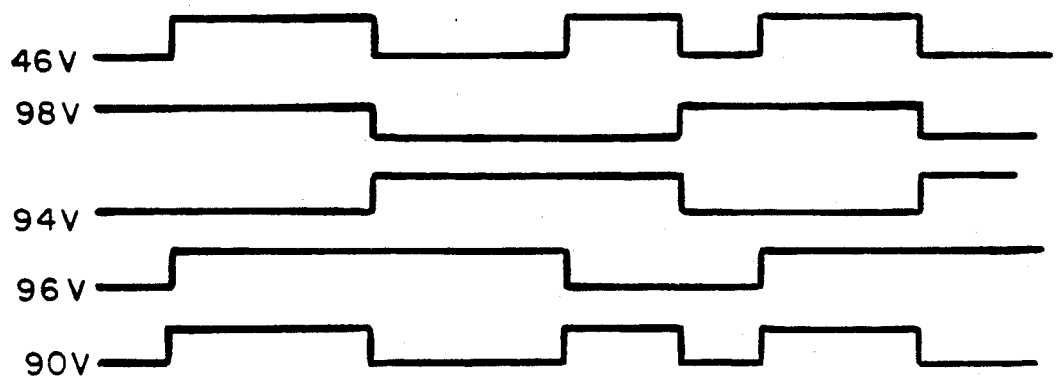
FIG. 7 is a timing diagram illustrating the waveforms produced at the nodes in the propagation delay compensation circuitry of FIG. 6

Delay circuit 80 is contrived to mimmic exactly the propagation delay through latch 72. Referring to FIGS. 6 and 7, signal 46V represents the data input signal at node 46 while signal 90V represents the delayed data signal at node 90. Signal 90V will follow signal 46V after two propagation delays (not shown). Upon the negative going edges of the input data signal, the propagation delay at node 90 is equal to the propagation delay of latch 84 plus that of XOR gate 86. Upon the positive going edges of the input data signal, the propagation delay at node 90 is equal to the propagation delay of latch 82 plus that of XOR gate 86. XOR gate 88 is a follower element which provides a fixed delay in the signal path from the output of latch 72, node 50, to the input of XOR gate 20, node 92. In this manner, the termination of the signal pulse at the output of XOR gate 20, node 56, is delayed, compensating for the delay through XOR gate 86.

In light of the above description of delay circuit 80 and the functional equivalents between the elements of phase detectors 12A and 12B, it will obvious to those skilled in the art that the theory of operation of phase detector 12B and circuit 10B follows the previous explanation given for phase detector 12A circuit 10A, respectively.

Figure 8:
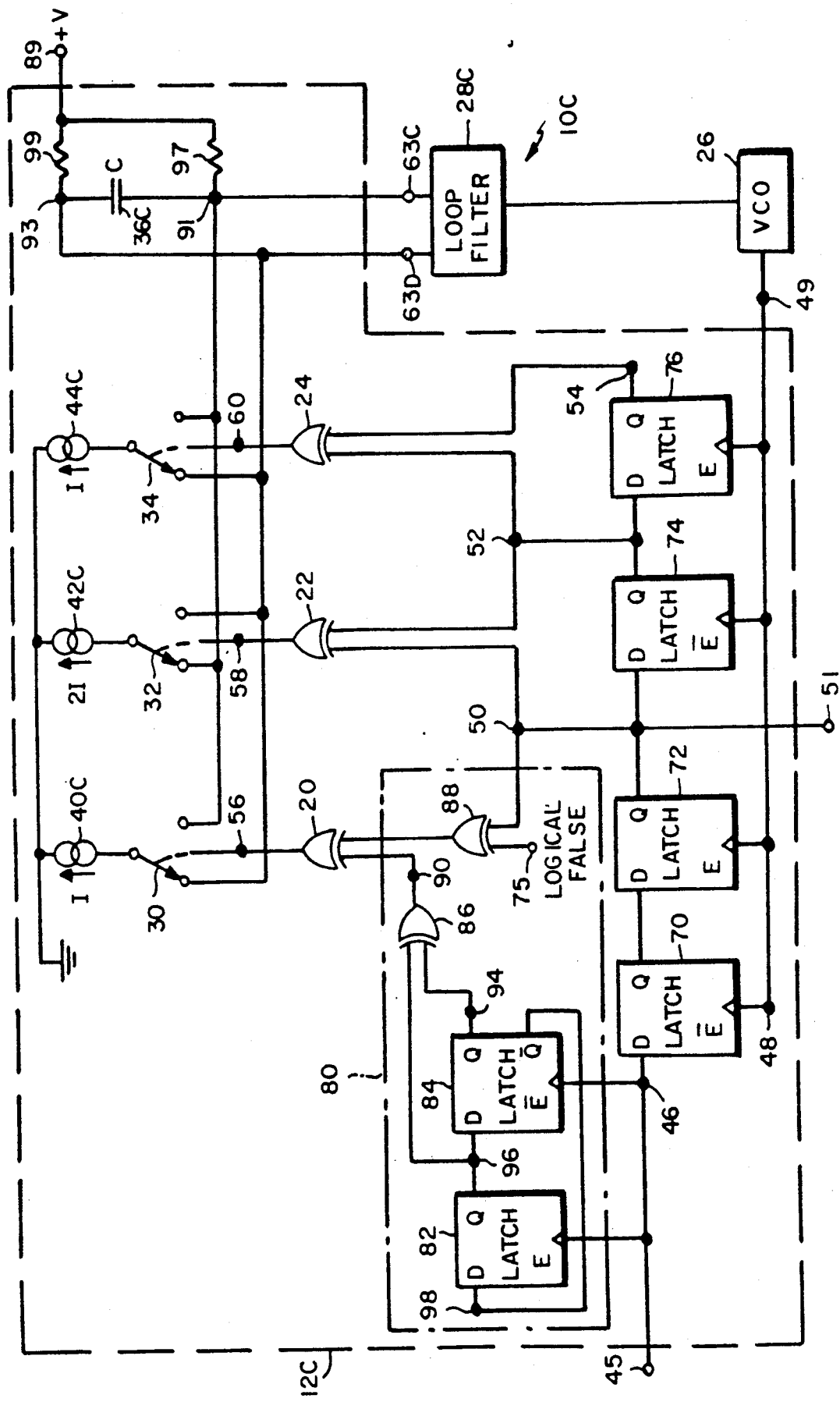
FIG. 8 is an alternate embodiment of the phase detector and phase-lock loop clock recovery circuit of FIG. 6 in which the phase detector has a differential output.

Referring to FIG. 8, a phase detector 12C and phase-locked loop clock recovery circuit 10C are illustrated as alternative embodiments to phase detector 12B and circuit 10B of FIG. 6, respectively. Phase detector 12C is substantially similar to phase detector 12B except that capacitor 36C has a differential ended configuration and phase detector 12C accordingly has a differential output at terminals 63C and 63D.

In phase detector 12C current sources 40C, 42C and 44C have the same polarity and capacitor 36C has both electrodes connected to a positive voltage source through resistors 97 and 99 and terminal 89. When XOR gate 20 produces a logical false signal at its output, node 56, switch 30 connects current source 40C to the first electrode of capacitor 36C, node 93. Similarly, when XOR gate 24 produces a logical false signal at its output, node 60, switch 34 connects current source 44C to the first electrode of capacitor 36C, node 93. When XOR gate 22 produces a logical false signal at its output node 58, switch 32 connects current source 42C to the second electrode of capacitor 36C, node 91.

A detailed operational description of phase detector 12C, containing differential ended capacitor 36C, will be obvious to electrical engineers in light of the previous operational description of phase detector 12A, containing "single-ended" capacitor 36A. Briefly, depending on the signals at the outputs of XOR gates, 20, 22 and 24, current sources 40C, 42C and 44C, respectively, are connected to the electrodes of capacitor 36C producing a charge on the capacitor. The charge on capacitor 36C results in a voltage difference across output terminals 36C and 36D, which represents the phase error signal of phase detector 12C. In the phase-locked loop clock recovery system 10C of FIG.ure 8, loop filter 28C must have a differential input stage to detect the net voltage difference across output terminals 63C and 63D. The design of such a loop filter will be obvious to electrical engineers.

Figure 9:
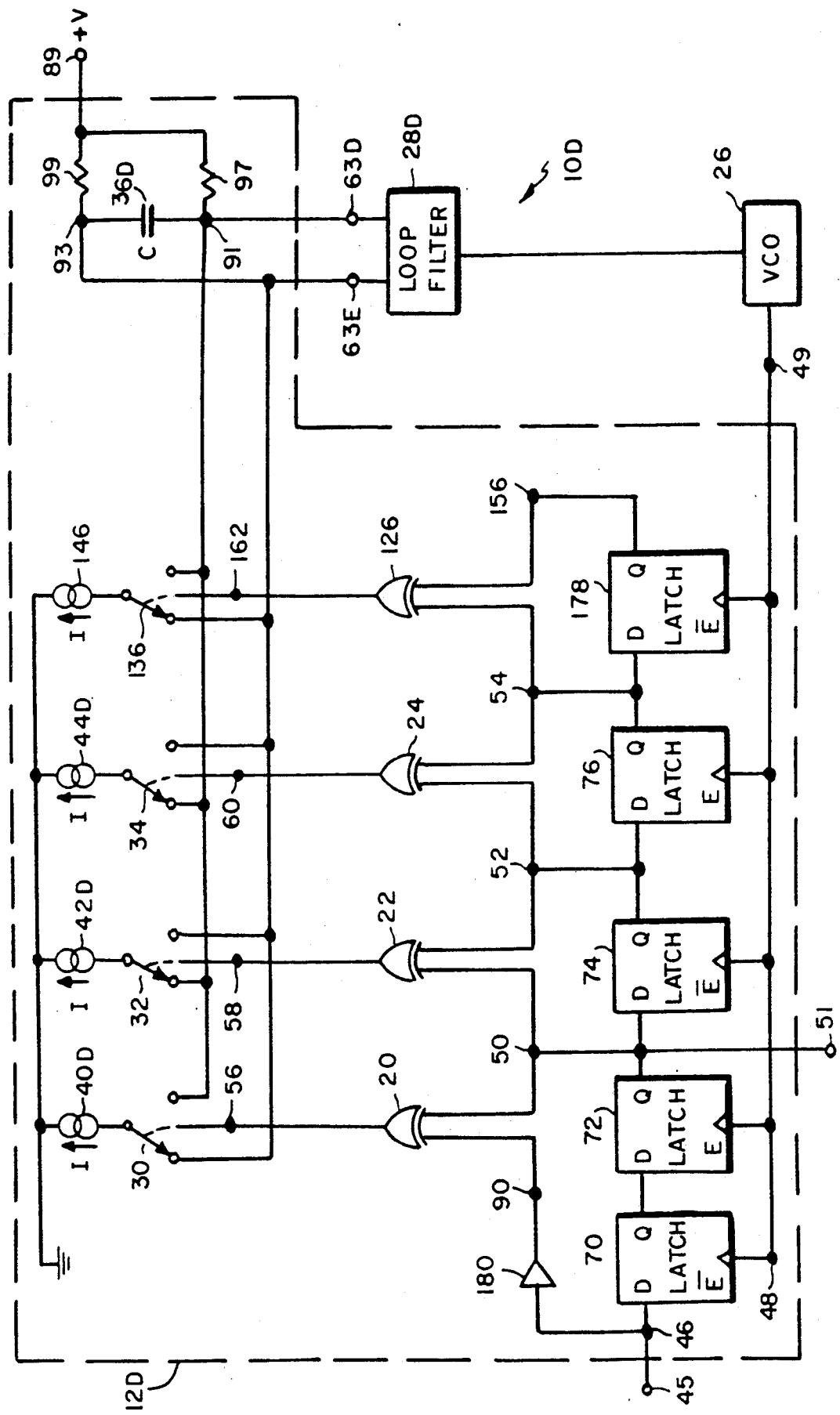
FIG. 9 is a schematic diagram of a second embodiment of a phase detector and phase-lock loop clock recovery circuit in accordance with the present invention.

Referring to FIG. 9, a second embodiment of the present invention, phase detector 12D and a phase-lock loop clock recovery circuit 10D are illustrated. Circuit 10D is identical to circuit 10C of FIG. 8. Phase detector 12D is substantially similar to detector 12C of FIG. 8 except that an additional information signal sampling module, comprising latch 178 and XOR gate 126, has been added. Latch 178 and XOR gate 126 receive the data output of latch 76. XOR gate 126 further receives the data output of latch 178. Latch 178 and XOR gate 126 function similarly to the other signal sampling modules of the previous embodiment. The output of XOR gate 126 controls the configuration of a switch 136 to divert current from a current source 146 to electrodes of capacitor 36D, as similar to switch 30 and current source 40 of phase detector 12C of FIG. 8. Also, all current sources of phase detector 12D are of the same magnitude and polarity, as indicated in FIG. 9.

In addition, the delay circuit 80 of FIG. 12C has been replaced by an inverting logic gate 180 coupled intermediate node 45 and node 90 as indicated in FIG. 9. Gate 180 has been added to phase detector 12D to compensate for the inherent propagation delay of latch 72 and to ensure that the signals present at the inputs of XOR gate 20 arrive coincidentally.

It will be obvious to those skilled in the art that the theory of operation of phase detector 12D of circuit 10D follows the previous explanation qiven for phase detector 12A-D and circuit 10A-D respectively, with the only notable difference being that a time interval of two clock cycles is required to measure phase error versus the one and a half clock cycles required for the first embodiment of FIGS. 3, 6 and 8. Referring to FIG. 4, the high to low transition of signal 62V which occurs between time $t_2$ and $t_3$ in the first embodiment, in the second embodiment will occur over a full clock cycle, namely from $t_2$ to $t_4$.

It will be obvious to those skilled in the art that any plurality of signal sampling modules may be used with the phase detector circuit of the present invention with the time interval required to measure phase error and the shape of the phase error signal varying according to the number of signal sampling modules contained therein.

Having thus described particular embodiments, various alterations, modifications and improvements will readily occur to those skilled in the art. Such alterations, modifications and improvements as are made obvious by this disclosure are intended to be part of this disclosure, although not expressly stated therein, and are intended to be in the spirit and scope of the invention. Accordingly, the foregoing description is intended to be exemplary only, and not limiting. The invention is only limited as defined in the following claims and equivalents thereto.

What is claimed is:

1. A phase detector circuit for detecting the phase difference between an information signal and a clock signal and for producing a phase error signal representative of the phase difference, said clock signal being of a pulse type waveform having first and second edges, said information signal being of a pulse type waveform having a high level portion and a low level portion, said phase detector comprising:

a first flip-flop having a data input for receiving said information signal, said first flip-flop being clocked by the first edge of said clock signal;

a second flip-flop having a data input for receiving the data output of said first flip-flop, said second flip-flop being clocked by the second edge of said clock signal;

a third flip-flop having a data input for receiving the data output of said second flip-flop, said third flip-flop being clocked by said first edge of said clock signal;

a first exclusive-OR gate which receives, at one input thereof, said information signal and, at a second input thereof, the data output of said first flip-flop;

a second exclusive-OR gate which receives, at one input thereof, the data output of said first flip-flop and, at a second input thereof, the data output of said second flip-flop;

a third exclusive-OR qate which receives, at a first input thereof, the data output of said second flip-flop and, at a second input thereof, the data output of said third flip-flop;

a capacitor having at least a first electrode serving as an output terminal for producing said phase error signal; and control means, responsive to the output of said first, second and third exclusive-OR gates, for controlling the voltage across said capacitor.

2. The phase detector circuit of claim 1 in which said control means comprises:

a first current source having a first lead connected to ground;

a second current source, having twice the magnitude and opposite polarity of said first current source, and further having a first lead connected to ground;

a third current source having a first lead connected to ground;

a first switch means, responsive to the output of said first exclusive-OR gate, for connecting a second lead of said first current source and said first electrode, when the output of said first exclusive-OR gate produces a logical true signal;

a second switch means, responsive to the output of said second exclusive-OR gate, for connecting a second lead of said second current source to said first electrode, when the output of said second exclusive-OR gate produces a logical true signal; and a third switch means, responsive to the output of said third exclusive-OR gate, for connecting a second lead of said third current source to said first electrode, when the output of said third exclusive-OR gate produces a logical true signal, and wherein a second electrode of said capacitor is connected to ground.

3. The phase detector circuit of claim 2 in which said first switch means connects the second lead of said first current source to ground, when the output of said first exclusive-OR gate produces a logical false signal.

4. The phase detector circuit of claim 2 in which said second switch means connects the second lead of said second current source and ground, when the output of said second exclusive-OR gate produces a logical false signal.

5. The phase detector circuit of claim 2 in which said third switch means connects the second lead of said third current source to ground, when the output of said third exclusive-OR gate produces a logical false signal.

6. The phase detector circuit of claim 1 in which said capacitor has a second electrode serving as a second output terminal, the voltage difference between said first electrode and said second electrode representative of said phase error signal and said control means comprises:

a first current source having a first lead connected to ground;

a second current source, having twice the magnitude of said first current source, and further having a first lead connected to ground;

a third current source having a first lead connected to ground;

a first switch means, responsive to the output of said first exclusive-OR gate, for connecting a second lead of said first current source and said first electrode. when the output of said first exclusive-OR gate produces a logical false signal; and for connecting the second lead of said first current source to said second electrode, when the output of said first exclusive-OR gate produces a logical true signal;

a second switch means, responsive to the output of said second exclusive-OR gate, for connecting a second lead of said second current source to said second electrode, when the output of said second exclusive-OR gate produces a logical false signal and for connecting the second lead of said second current source to said first electrode, when the output of said second exclusive-OR gate produces a logical true signal; and a third switch means, responsive to the output of said third exclusive-OR gate, for connecting a second lead of said third current source to said first electrode, when the output of said third exclusive-OR gate produces a logical false signal and for connecting the second lead of said third current source to said second electrode, when the output of said third exclusive-OR gate produces a logical-true signal, and wherein said first and second electrode of said capacitor is connected to first and second resistors, respectively, said resistors being further connected to a common voltage source.

7. The phase detector circuit of claim 1 further comprising a delay means for receiving said information signal and the data output of said second latch and for producing a delayed information signal and a delayed data output signal.

8. The phase detector circuit of claim 1 in combination with a voltage controlled oscillator, responsive to said phase error signal, for producing a clock signal, the frequency of which is dependent upon said phase error signal.

9. The combination circuit of claim 8 further in combination with a signal processing means, responsive to said phase error signal, for producing a modified phase error signal to which said voltage controlled oscillator is responsive.

10. The phase detector circuit of claim 1 in which the signal present at the output of said second flip-flop represents said information signal in phase with said clock signal.

11. A phase detector circuit for detecting the phase difference between an information signal and a clock signal and for producing a phase error signal representative of the phase difference, said clock signal and said information signal being of a pulse-type waveform having a high-level portion and a low-level portion, said phase detector comprising:
   a first latch having a data input for receiving said information signal, said first latch being enabled by the low-level portion of said clock signal;
   a second latch having a data input for receiving the data output of said first latch, said second latch being enabled by the high-level portion of said clock signal;
   a third latch having a data input for receiving the data output of said second latch, said third latch being enabled by the low-level portion of said clock signal;
   a fourth latch having a data input for receiving the data output of said third latch, said fourth latch being enabled by the high-level portion of said clock signal;
   a delay means for receiving said information signal and the data output of said second latch and for producing a delayed information signal and a delayed data output signal;
   a first exclusive-OR gate which receives, at a first input thereof, said delayed information signal and, at a second input thereof, said delayed data output signal;
   a second exclusive-OR gate which receives, at a first input thereof, the data output of said second latch and, at a second input thereof, the data output of said third latch;
   a third exclusive-OR gate which receives, at a first input thereof, the data output of said third latch and, at a second input thereof, the data output of said fourth latch;
   a capacitor having at least a first electrode serving as an output terminal for producing said phase error signal; and
   control means, responsive to the output of said first, second and third exclusive-OR gates, for controlling the voltage across said capacitor.

12. The phase detector circuit of claim 11 in which said control means comprises:
   a first current source having a first lead connected to ground;
   a second current source, having twice the magnitude and opposite polarity of said first current source, and further having a first lead connected to ground;
   a third current source having a first lead connected to ground;
   a first switch means, responsive to the output of said first exclusive-OR gate, for connecting a second lead of said first current source and said first electrode, when the output of said first exclusive-OR gate produces a logical true signal;
   a second switch means, responsive to the output of said second exclusive-OR gate, for connecting a second lead of said second current source to said first electrode, when the output of said second exclusive-OR gate produces a logical true signal; and
   a third switch means, responsive to the output of said third exclusive-OR gate, for connecting a second lead of said third current source to said first electrode, when the output of said third exclusive-OR gate produces a logical true signal,
   and wherein a second electrode of said capacitor is connected to ground.

13. The phase detector circuit of claim 12, in which said first switch means connects the second lead of said first current source to ground, when the output of said first exclusive-OR gate produces a logical false signal.

14. The phase detector circuit of claim 12 in which said second switch means connects the second lead of said second current source and ground, when the output of said second exclusive-OR gate produces a logical false signal.

15. The phase detector circuit of claim 12 in which said third switch means connects the second lead of said third current source to ground, when the output of said third exclusive-OR gate produces a logical false signal.

16. The phase detector circuit of claim 11 in which said capacitor has a second electrode serving as a second output terminal, the voltage difference between said first electrode and said second electrode representative of said phase error signal and said control means comprises:
   a first current source having a first lead connected to ground;
   a second current source, having twice the magnitude of said first current sorce, and further having a first lead connected to ground;
   a third current source having a first lead connected to ground;
   a first switch means, responsive to the output of said first exclusive-OR gate, for connecting a second lead of said first current source and said first electrode when the output of said first exclusive-OR gate produces a logical false signal and for connecting the second lead of said first current source to said second electrode, when the output of said first exclusive-OR gate produces a logical true signal;
   a second switch means, responsive to the output of said second exclusive-OR gate, for connecting a second lead of said second current source to said second electrode, when the output of said second exclusive-OR gate produces a logical false signal and for connecting the second lead of said second current source to said first electrode, when the output of said second exclusive-OR gate produces a logical true signal; and
   a third switch means, responsive to the output of said third exclusive-OR gate, for connecting a second lead of said third current source to said first electrode, when the output of said third exclusive-OR gate produces a logical false signal and for connecting the second lead of said third current source to said second electrode, when the output of said third exclusive-OR gate produces a logical-true signal, and wherein said first and second electrode of said capacitor is connected to first and second resistors, respectively, said resistors being further connected to a common voltage source.

17. The phase detector circuit of claim 11 in which said delay means comprises:

a first delay latch, being enabled by the high-level portion of said information signal;

a second delay latch having a data input for receiving the data output of said first delay latch, said second delay latch being enabled by the low-level portion of said information signal;

a fourth exclusive-OR gate which receives, at a first input thereof, the data output of said first delay latch and, at a second input thereof, the data output of said second delay latch, the output of said fourth exclusive-OR gate producing said delayed information signal; and a fifth exclusive-OR gate having a first input connected to the data input of said second exclusive-OR gate and further having second input connect to a logical false signal, the output of said fifth exclusive-OR gate producing said delayed data output signal;

and wherein said first delay latch has a data input for receiving the inverted data output of said second delay latch.

18. The phase detector circuit of claim 11 in combination with a voltage controlled oscillator, responsive to said phase error signal, for producing a clock signal, the frequency of which is dependent upon said phase error signal.

19. The combination circuit of claim 18 further in combination with a signal processing means, responsive to said phase error signal, for producing a modified phase error signal to which said voltage controlled oscillator is responsive.

20. The phase detector circuit of claim 11 in which the signal present at the output of said second latch represents said information signal in phase with said clock signal.

21. The phase detector of claim 11 inwhich the signal present at the output of said third latch represents said information signal in phase with said clock signal.

22. A phase detector circuit for detecting the phase difference between an information signal and a clock pulse and for producing, at an output terminal thereof, a phase error signal representative of said phase difference, said phase detector comprising:

a. at least three information signal sampling modules, each of said modules comprising
  (i) a flip-flop having a data input and a data output, said flip-flop being clocked by said clock pulse,
  (ii) an exclusive-OR gate having one input connected to the data input of said flip-flop and a second input connected to the data output of said flip-flop, said exclusive-OR gate also having an output;

a first of said information signal sampling modules being connected to receive at its data input said information signal and being clocked by a selected phase of said clock pulse;

c. each $i^{th}$ module subsequent to the first module receiving at its data input, the data output of the $(i-1)^{th}$ module, said $i^{th}$ module being clocked on a different phase of said clock pulse than the $(i-1)^{th}$ module; and d. means responsive to the outputs of said exclusive-OR gates for creating said phase error signal.

23. The apparatus as recited in claim 22 wherein said means responsive to said exclusive-OR gates comprises:

a plurality of current sources, each current source associated with one of said plurality of sampling modules, each of said current sources having a first lead connected to qround, and a plurality of switch means, each associated with one of said plurality of sampling modules, each of said switch means responsive to the output of the exclusive-OR gate of said associated sampling module, for connecting the second lead of said current source to said output terminal when the output of said exclusive-OR gate produces a logical true signal.

24. A phase detector as recited in claim 23 wherein said means resposive to said exclusive-OR gates further comprises:

a capacitor having a first electrode connected to ground and a second electrode serving as said output terminal for producing said phase error signal.

25. The phase detector circuit of claim 20 wherein said plurality of information signal sampling modules consists of four information signal sampling modules.

26. The phase detector circuit of claim 20 in combination with a voltage-controlled oscillator, responsive to said phase error signal, for producing a clock signal, the frequency of which is dependent upon said phase error signal.

27. The combination circuit of claim 22 further in combination with a signal processing means, responsive to said phase error signal, for producing a modified phase error signal to which said voltage controlled oscillator is responsive.

* * * * *